US006179925B1

(12) United States Patent
Schmitt et al.

(10) Patent No.: US 6,179,925 B1
(45) Date of Patent: Jan. 30, 2001

(54) METHOD AND APPARATUS FOR IMPROVED CONTROL OF PROCESS AND PURGE MATERIAL IN SUBSTRATE PROCESSING SYSTEM

(75) Inventors: John Schmitt, Sunnyvale; Bo Zheng, San Jose; Mei Chang, Saratoga; Stephen Voss, Mountainview, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/311,449

(22) Filed: May 14, 1999

(51) Int. Cl.$^7$ .................................................. C23C 16/00
(52) U.S. Cl. ......................... 118/726; 219/394; 118/715
(58) Field of Search ................................ 118/715, 726; 219/394; 134/166 C, 169 C

(56) References Cited

U.S. PATENT DOCUMENTS

| | | | |
|---|---|---|---|
| 5,362,328 | * 11/1994 | Gardiner et al. | 118/726 |
| 5,380,370 | * 1/1995 | Niino et al. | 134/22.12 |
| 5,492,724 | * 2/1996 | Klinedinst et al. | 118/726 |
| 5,690,743 | * 11/1997 | Murakami et al. | 118/726 |
| 5,698,037 | * 12/1997 | Stauffer | 118/726 |
| 5,730,804 | * 3/1998 | Gomi et al. | 134/22.12 |
| 5,775,416 | * 7/1998 | Heimanson et al. | 165/275 |
| 5,953,630 | * 9/1999 | Maeda et al. | 438/680 |

OTHER PUBLICATIONS

U.S. application No. 09/096,996, Zheng et al., filed Jun. 13, 1998.

J. Norman, D. Roberts, A. Hochberg, P. Smith, G. Petersen, J. Parmeter, C. Apblett, T. Omstead, "Chemical Additives for Improved Copper Chemical Vapour Deposition Processing", Thin Solid Films 262 (1995) pp. 46–51.

C. Marcadal, E. Richard, J. Mermet, J. Torres, J. Torres, J. Palleau, B. Alaux, M. Bakli, "Cu–CVD Process Optimised in a Cluster Equipment for IC Manufacturing:", Microelectronic Engineering 33 (1997) pp. 3–13.

A. Gelatos, R. Marsh, M. Kotte, C.F. Mogab, "Chemical Vapor Deposition of Copper from Cu+1 Precursors in the Presence of Water Vapor", Appl. Phys. Lett. 63 (20) Nov. 15, 1993, pp. 2842–2844.

C-M Chiang, T. Miller, L. Dubois, "Role of Solvents in Chemical Vapor Deposition: Implications for Copper Thin-Film Growth", Journal of Phys. Chem 97, 11781 (93).

* cited by examiner

Primary Examiner—Jeffrie R. Lund
Assistant Examiner—Sylvia R MacArthur
(74) Attorney, Agent, or Firm—Thomason, Moser & Patterson

(57) ABSTRACT

A method and apparatus for control of precursor and purge additive materials in a deposition system comprising a precursor material delivery system and a plurality of purge additive transfer lines connected between or at components in the precursor material delivery system. One of the plurality of purge additive transfer lines is connected between an ampoule and a liquid mass flow controller, another is connected between the liquid mass flow controller and a vaporizer and a third is connected to the vaporizer. The apparatus further comprises a process chamber connected to the precursor material delivery system and having a susceptor wherein one of the plurality of purge additive transfer lines is connected to the susceptor. With the apparatus and accompanying method, formation of particulate contaminants is greatly reduced. The purge additive provided at strategic locations within the deposition system provides a stabilizing effect to any precursor that remains in the transfer lines and helps to control the CVD reaction at the exclusion zone.

16 Claims, 7 Drawing Sheets

METHOD AND APPARATUS FOR IMPROVED CONTROL OF PROCESS AND PURGE MATERIAL IN SUBSTRATE PROCESSING SYSTEM

BACKGROUND OF THE DISCLOSURE

1. Field of the Invention

The present invention is directed toward the field of manufacturing integrated circuits. The invention is more particularly directed toward an improved method and apparatus for introducing process and purge material in a deposition process system.

2. Description of the Related Art

Presently, aluminum is widely employed in integrated circuits as an interconnect, such as plugs and vias. However, higher device densities, faster operating frequencies, and larger die sizes have created a need for a metal with lower resistivity than aluminum to be used in interconnect structures. The lower resistivity of copper makes it an attractive candidate for replacing aluminum.

There are a few well established techniques for depositing copper including, chemical vapor deposition ("CVD"), physical vapor deposition ("PVD") and electrodeposition. In one known method, chemical vapor deposition of copper is achieved by using a precursor material known as Cupraselect®, which has the formula Cu(hfac)L. Cupraselect® is a registered trademark of Schumacher of Carlsbad, Calif. The Cupraselect® consists of copper (Cu) bonded to a deposition controlling compound such as (hfac) and a thermal stabilizing compound (L). The (hfac) represents hexafluoroacetylacetonato, and (L) represents a ligand base compound, such as trimethylvinylsilane ("TMVS"). This precursor material is vaporized and flowed into a deposition chamber containing a wafer. In the chamber, the vaporized precursor material is heated at the wafer's surface. At the desired temperature the following reaction results:

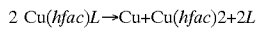

$$2\ Cu(hfac)L \rightarrow Cu + Cu(hfac)2 + 2L \qquad \text{(Eqn. 1)}$$

The resulting copper (Cu) deposits on the surface of the wafer. The byproducts of the reaction (i.e., Cu(hfac)$_2$ and (2L) are purged from the chamber which is maintained at a vacuum during wafer processing.

In some instances, a Cupraselect® blend is used as the precursor material. The Cupraselect® blend is Cu(hfac)L with extra (hfac) blended with the Cu(hfac)L for additional stability. One problem associated with using blended Cupraselect® for CVD is the delivery of the material from its liquid storage ampoule to the process chamber in which the CVD occurs. Typically, the liquid Cupraselect® (or blend) is stored in bulk and is passed to the process chamber via a direct liquid injection (DLI) system. The DLI system vaporizes the precursor material in close proximity to the wafer. Such a system is seen and described in commonly assigned patent application entitled, "Method and Apparatus for Improved Control of Process and Purge Material in a Substrate Processing System" by Schmitt, et al. filed Jul. 21, 1998. After vaporization, the Cupraselect® is pumped into the process chamber via a carrier gas such as Argon, Helium or other inert gases. This pumping action tends to pull a high concentration of TMVS out of the Cupraselect® blend leaving the less stable copper and hfac. Under these conditions, deposition is likely to occur at undesirable locations. For example, deposition can occur near the vaporizer, valves, process chamber showerhead, and the like. Deposition changes the dimensions of these critical system components which degrades performance of the chamber and the resultant deposition layer on the wafer. Additionally, unwanted deposition may flake off during the deposition process which can render a processed wafer faulty or unusable. A maintenance cycle would then have to be run on the process chamber to replace or clean the chamber which reduces system productivity.

Similar difficulties exist at other times within the CVD system. For example, when a precursor material ampoule is nearly empty and is to be replaced, the transfer lines between the ampoule and the process chamber must be pumped out. Similar to the process pumping, transfer line purge pumping pulls greater concentrations of TMVS out of the residual Cupraselect® blend remaining in the transfer lines leaving the less stable Cu and (hfac) which can cause particles (deposition) to form in the transfer lines or in the valve that accepts the ampoule. When a new ampoule (under pressure) is installed, the flow of high pressure liquid Cupraselect® can easily dislodge particles formed in the lines and valves and carry such particles down to other delivery equipment or the process chamber.

Additionally, during the deposition process, edge purge gas is provided at the wafer to keep copper from depositing on the edge (exclusion zone) and backside of the wafer. The edge purge gas (typically an inert gas such as Argon) diffuses around the edge of the wafer to redirect the flow of any process gases such as vaporized Cupraselect® away from edge of the wafer. Typically, the wafer is a silicon or silicon dioxide based substrate. In such substrates, copper can easily diffuse into the wafer thereby introducing additional conductive particles. Such contamination can short devices (i.e., gate structures) being fabricated on the wafer. The physical interaction of the purge gas on the process gas that reduces deposition at the exclusion zone and wafer backside. Additionally, metal etching of copper is not easily accomplished; other processes such as Chemical Mechanical Polishing (CMP) are used instead. Unfortunately, CMP can also create particles at the edge of the wafer that can be transferred to subsequent chambers.

Accordingly, it is desirable to provide an apparatus and method for improved control and handling of precursor material and purge additives in a substrate process system to reduce the likelihood of deposition or particle formation within the system as well as enhance the edge purge gas capabilities.

SUMMARY OF THE INVENTION

The disadvantages associated with the prior art are overcome with the present invention of an apparatus for control of precursor material and purge additive in a deposition process system comprising a vapor-phase purge additive delivery system connected to the deposition process system. Further, a plurality of purge additive transfer lines communicate between the deposition process system and the purge additive delivery system. The purge additive is a gas phase or vapor of the stabilizer liquid (TMVS) The precursor material delivery system further comprises an ampoule, a liquid mass flow controller connected to the ampoule and a vaporizer connected to the liquid mass flow controller. One of the plurality of purge additive transfer lines is connected between the ampoule and the liquid mass flow controller, another is connected between the liquid mass flow controller and the vaporizer and a third is connected to the vaporizer. The apparatus further comprises a process chamber connected to the precursor material delivery system and having a susceptor wherein one of the plurality of purge additive transfer lines is connected to the susceptor.

Additionally, a method for controlling contaminant particle production in a deposition system comprises heating a substrate upon a susceptor in the deposition chamber, introducing a precursor and carrier materials from a precursor material delivery system to begin CVD, introducing purge additive to the chamber and introducing a purge additive to the precursor material delivery system to reduce deposition therein. The step of introducing a purge additive to the chamber further comprises providing a purge additive to an edge of the wafer and the step of providing purge additive to the deposition system further comprises the step of introducing a purge additive to a vaporizer and a connection between the liquid mass flow controller and vaporizer.

With the apparatus and accompanying method, formation of particulate contaminants is greatly reduced. The purge additive provided at strategic locations within the deposition system provides a stabilizing effect to any precursor material that remains in the transfer lines. The presence of the excess (L) greatly reduces the reaction that produces solid Cu. As such, the precursor material is less likely to break down and form particles (e.g., copper) in places other than on the substrate being processed. Additionally, providing the purge additive at the susceptor helps to control the CVD reaction at the exclusion zone.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The novel features of the present invention provide for the delivery of a purge additive (i.e., vapor or gas) to a process system in a controlled fashion. The presence of the purge additive at key locations in the system inhibits the formation of particles on the interior of precursor material transfer lines and the chamber. The improved delivery system is arranged such that the purge additive can be used to flush or purge precursor material from the transfer lines so that the delivery of precursor material is precisely repeated for each deposition. Further, the purge additive may be incorporated into an edge purge material to inhibit process reactions from undesirably occurring at the circumferential edge of a substrate such as a silicon wafer being processed. Although the invention is described in terms of copper thin films grown by CVD, those skilled in the art will recognize that the invention may be applied to any thin film deposition process where it is desirable to provide purge additives at key locations in a deposition system to improve the resultant film and reduce contamination levels in the system.

Figure 1:
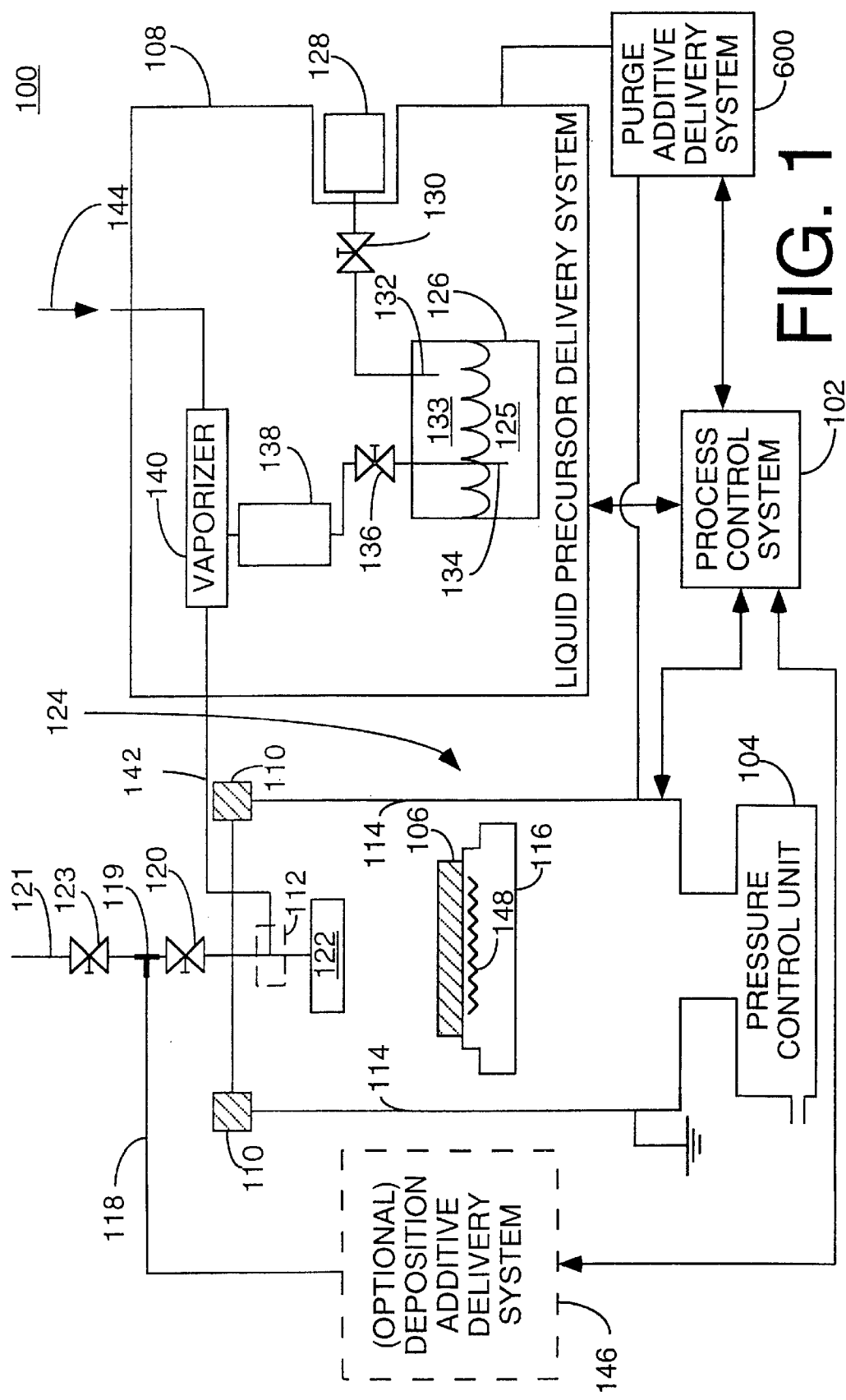
FIG. 1 illustrates a schematic of a first embodiment of a CVD copper deposition system of the present invention.

A first embodiment of the apparatus of the present invention is schematically depicted in FIG. 1. In a deposition process system 100, a liquid precursor 125, such as a Cupraselect® blend, is delivered to a deposition chamber 124 from a precursor delivery system 108 via one or more precursor material transfer lines 142. Specifically, the liquid precursor 125 is vaporized and delivered to a showerhead 122 in the deposition chamber 124. One example of a deposition chamber that can be used is a model WxZ chamber manufactured by Applied Materials, Inc. of Santa Clara, Calif., that is modified to perform copper deposition in accordance with the invention. The deposition chamber 124 contains a heated susceptor 116 for retaining a substrate such as a semiconductor wafer 106 onto which it is desirable to deposit copper. Copper is deposited onto the substrate 106 by CVD when the vaporized precursor contacts the heated substrate. To further enhance a deposition of copper, a deposition additive (e.g., water vapor) system 146 may optionally be added to the deposition system 100. The deposition additive delivery systems 146 is connected to the process chamber 124 via transfer line 118. A complete description of a suitable deposition additive delivery system 146 is included in U.S. patent application Ser. No. 09/096, 996 filed Jun. 13, 1998 entitled "Controlled Addition of Water During Chemical Vapor Deposition of Copper to Improve Adhesion". A purge additive delivery system 600 (described in greater detail below) is connected to the deposition process system 100 for reducing particulate contaminants. The chamber 124, precursor delivery system 108, purge additive delivery system 600 and optional deposition additive delivery system 146 are controlled by a process control system 102.

The process chamber 124 is defined by a set of walls 114 that are electrically and thermally isolated from the susceptor 116 and showerhead 122 by isolators 110. Thermal energy, from a heating element 148 such as a resistive coil, heats a top surface of the susceptor 116 in accordance with control signals sent by the process control system 102.

A pressure control unit 104, e.g., a vacuum pump, is coupled to the process chamber 124 for setting the pressure in the process chamber 124 in accordance with control signals sent by the process control system 102. The pressure control unit 104 also provides for purging reactant byproducts from the process chamber 124. The pressure control unit 104 may also be coupled to a foreline 121 to provide for purging of the various transfer lines 118, 142.

In one example of a precursor delivery system, an inert gas, such as helium or argon, from a pressurized source 128 is delivered through a valve 130. The gas proceeds to flow to an inlet 132 located above a level of a precursor 125 in a precursor ampoule 126 pressurizing a head space 133 above the precursor 125. The pressure in the head space 133 forces the precursor 125 through a precursor outlet 134 located below the level of the precursor 125 in the precursor ampoule 126. The precursor 125 flows through a precursor shutoff valve 136 and a liquid mass flow controller (LMFC) 138 to a precursor vaporizer 140. A second inert carrier gas, such as Argon, Krypton, Xenon, Helium, nitrogen or Neon, is provided by a second pressurized source 144 and mixes with the precursor 125 in the vaporizer 140. Alternatively, vaporization of the precursor can be accomplished by "bubbling" a carrier gas such as nitrogen, helium or hydrogen through the liquid precursor material. Vaporized precursor material and inert gas then flow through a precursor transfer line 142 to a mixer block 112 (optional), located above the showerhead 122. The vaporized precursor material and inert gas are delivered to the deposition chamber through the showerhead 122. The various valves (i.e., valves 130 and 136) controlling (i.e., LMFC 138) and all other such flow transfer and control devices are operated in accordance with control signals from the process control system 102.

Figure 2:
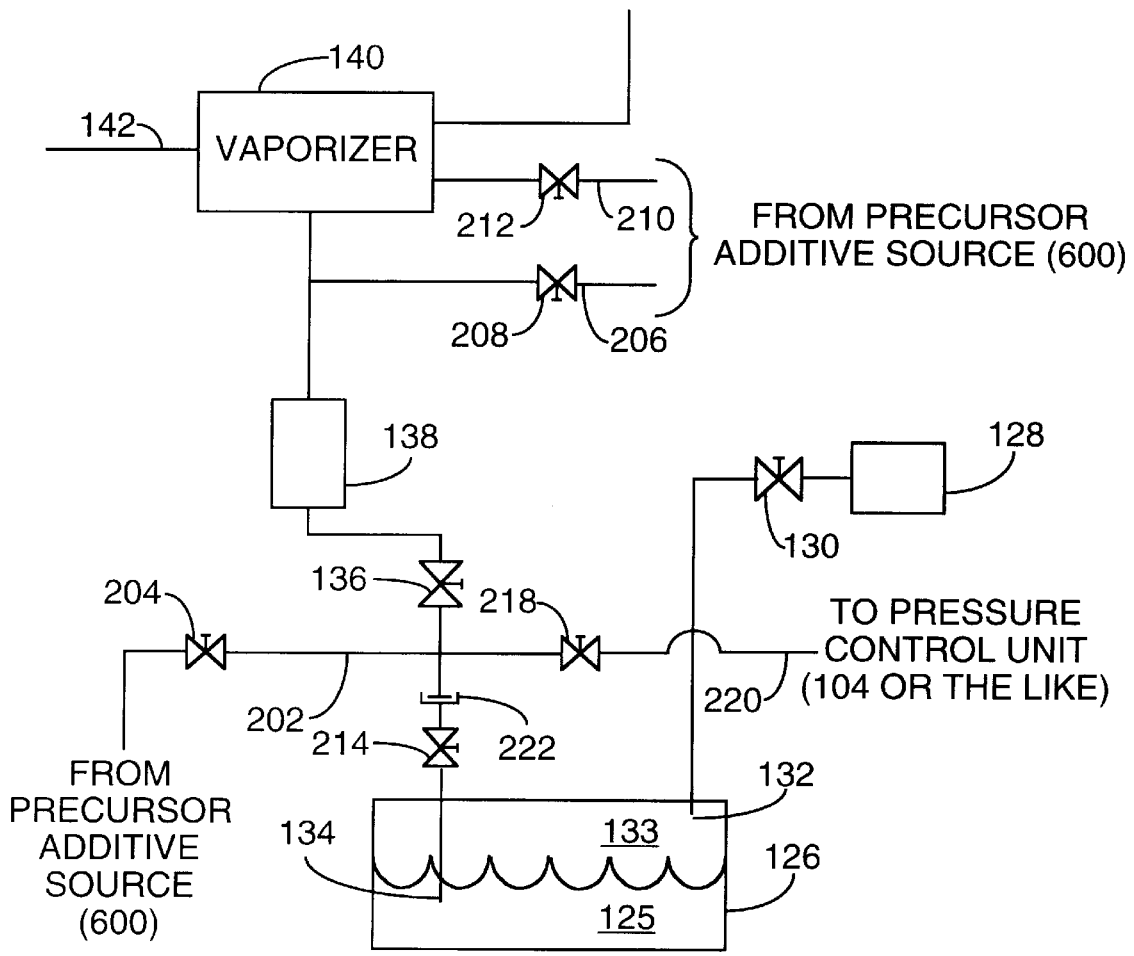
FIG. 2 is an enlarged and detailed schematic view of the precursor material delivery system portion of the present invention.
Figure 6:
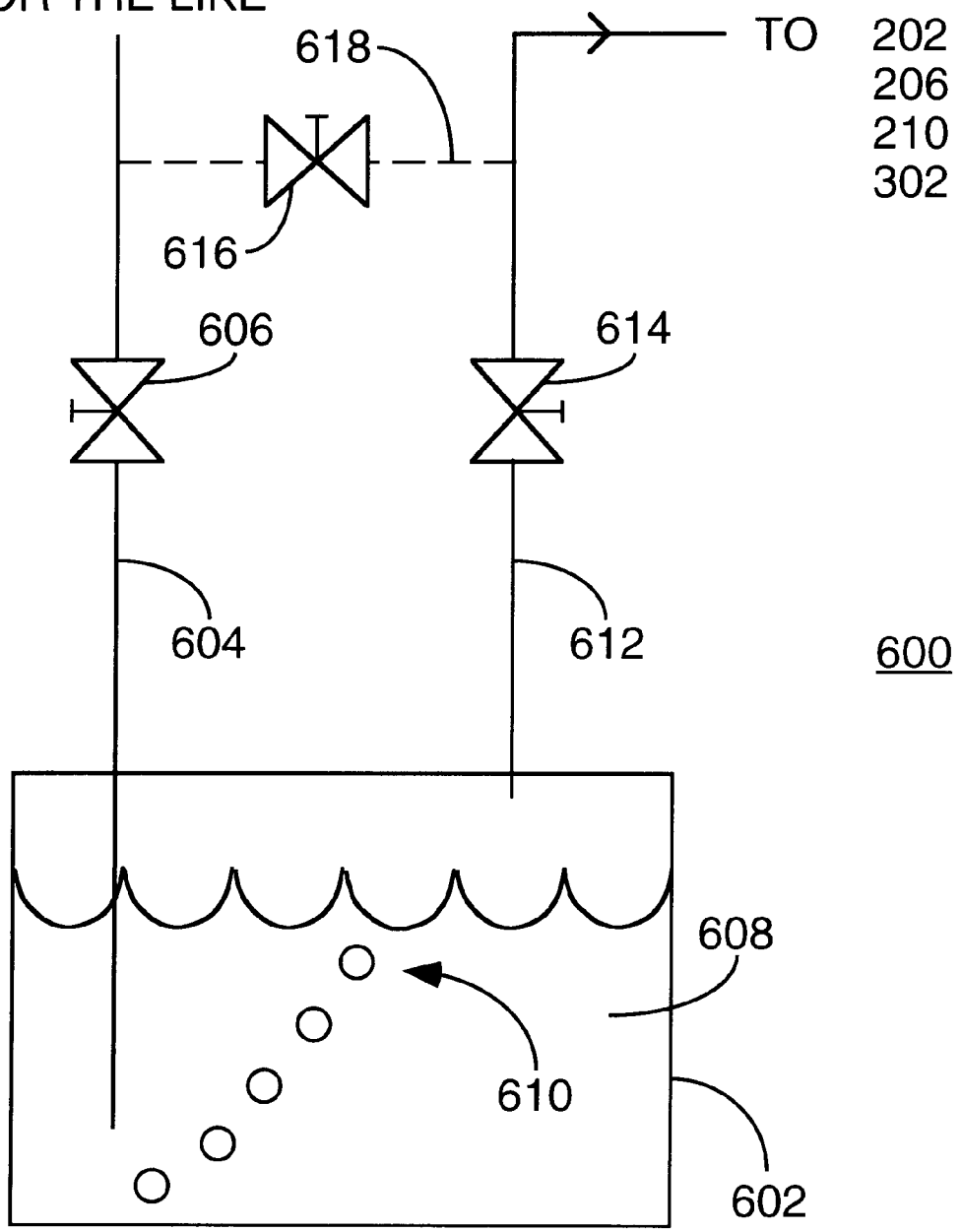
FIG. 6 illustrates the purge additive delivery system of the present invention.

FIG. 2 is an enlarged and further detailed schematic view of the precursor delivery system 108 cooperating with the purge additive delivery system 600 in accordance with the subject invention. Specifically, the purge additive delivery system comprises (among other elements) a plurality of purge additive transfer lines provided at key locations of the precursor delivery system 108 to reduce the likelihood of deposition within these lines as well as in the chamber 124. A first purge additive transfer line 202 is provided at the precursor outlet 134 proximate the precursor shutoff valve 136. The first purge additive transfer line 202 is further provided with a valve 204 to regulate a flow of purge additive from the purge additive delivery system 600 (seen in FIG. 6 and described in greater detail below). A second purge additive transfer line 206 is provided between the liquid mass flow controller 138 and the vaporizer 140. The second purge additive transfer line 206 is further provided with a valve 208 to regulate a flow of purge additive from the purge additive delivery system 600. A third purge additive transfer line 210 is provided at the vaporizer 140. The third purge additive transfer line 210 is further provided with a valve 212 to regulate a flow of precursor additive from a precursor additive source. In each instance, each transfer line 202, 206 and 210 may be connected to a separate purge additive delivery system. Alternately, all transfer lines may be connected to a single source.

The precursor delivery system 108 has additional plumbing and hardware to facilitate the control and movement of material through the system. Specifically, the precursor outlet 134 is provided with a control valve 214 to isolate the precursor ampoule 126 from the rest of the system 108. A fitting 222 couples the precursor outlet 134 to the precursor shutoff valve 136 and the first purge additive transfer line 202. The fitting also couples the precursor outlet 134 to a purge valve 218. The purge valve 218 is also connected to a purge line 220. The purge line 220 is further connected to a pressure control unit, e.g., the pressure control unit 104 or the like, for drawing excess material, i.e., extra precursor additive or precursor material from the connected lines and valves dependent upon an opened or closed valve position.

With the configuration of purge additive transfer lines as presented, purging of the deposition system 100 at various stages and for various reasons is easily accomplished. As discussed earlier, portions of a precursor (i.e., Cupraselect®) blend tends to be drawn off first thereby increasing the likelihood of the precursor material reacting and forming solid Cu in the transfer lines (i.e., 142 of FIG. 1). The first purge additive transfer line 202 enables purging of the precursor ampoule 126 when replacement of the ampoule becomes necessary. Specifically, pumping in purge additive prevents condensation or deposition of the precursor material at the precursor shutoff valve 136 and precursor outlet 134. Second purge additive transfer line 206 is useful for purging the volume of transfer line between the LMFC 138 and vaporizer 206. Although this volume is minimized to reduce the amount of liquid precursor material present at any one time, the presence and availability of purge additive at this location purges the volume to reduce deposition, subsequent particle formation and degraded delivery of precursor material to the vaporizer 140. Third purge additive transfer line 210 provides for purging in the vaporizer 140. This is important because the vaporizer 140 comprises one or more nozzles designed to properly aerate the liquid precursor to form vaporized precursor. If deposition occurs in the vaporizer 140 and especially at the nozzle tips, the nozzle design is altered and the desired vapor is not formed. Such a condition can degrade the CVD process as the vapor is delivered to the showerhead 122.

Figure 3:
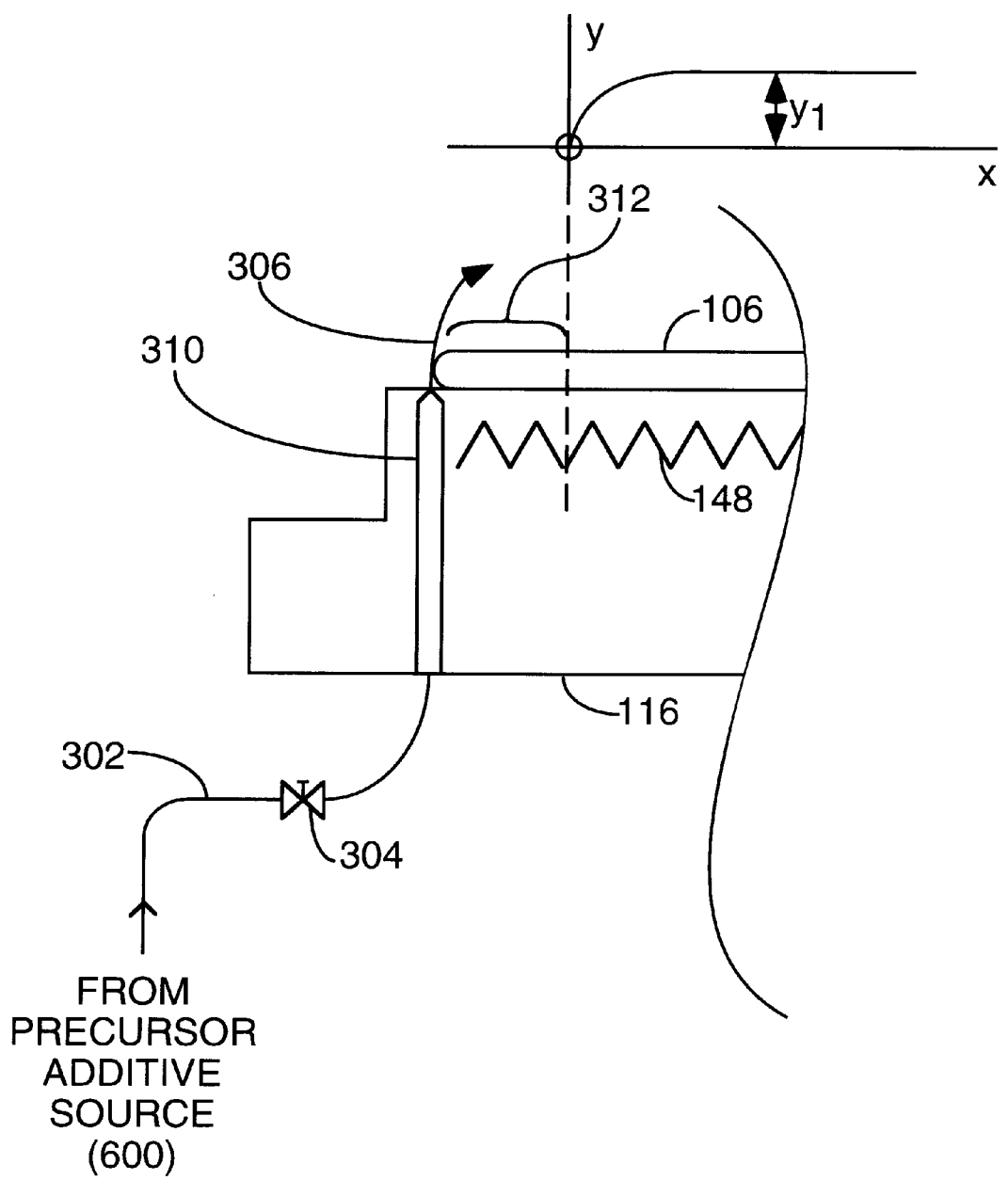
FIG. 3 is a schematic depiction of a further embodiment of the deposition system of the present invention.

FIG. 3 schematically depicts a further incorporation of a fourth purge additive transfer line 302 of the purge additive delivery system 600 cooperating with the deposition system 100. Specifically, fourth purge additive transfer line 302 is connected to the susceptor 116 to provide purge additive to the edge 312 (or exclusion zone) of a wafer 106 retained on the susceptor 116 during processing in the chamber 124. In the depicted embodiment, the purge additive delivery system 600 (see FIG. 6 and description below) is connected to the fourth additive transfer line 302. The fourth additive transfer line 302 is then connected to the susceptor 116 via a valve 304. The valve 304 connects to one or more orifices 310 in the susceptor 116. As such, a flow of purge additive 306 is provided at the edge 312 of the wafer 106. The flow 306 may also comprise one or more edge purge gases such as Argon, Helium or the like. It is believed that the combination of edge purge gas and purge additive creates a condition that reduces the likelihood of unwanted deposition at the exclusion zone 312. Specifically, the edge purge gas acts in a physical manner to push vaporized precursor material (such as Cupraselect®) away from the exclusion zone 312. Additionally, the purge additive acts in a chemical manner to stabilize the precursor material in the vicinity of the exclusion zone so as to reduce the likelihood of a chemical reaction of the precursor at the wafer 106. A graphical representation of how deposition layer thickness is affected and controlled by the subject invention is depicted in the upper portion of FIG. 3. A coordinate system is established whereby a y-axis (x=0) is coincident with the point on the wafer 106 where the exclusion zone 312 begins. To the left of the y-axis (x<0), the presence of purge additive stabilizes any potential reaction of the precursor material; hence, no deposition layer is formed. Just to the right of the y-axis (x≧0), the affect of the purge additive/edge purge is not as great and deposition begins. At points where x>0, deposition layer formation occurs at a desired thickness ($Y_1$).

The purge additive delivery system 600 described above is depicted in FIG. 6. The purge additive delivery system is a "bubbler" type apparatus capable of "aerating" a purge additive that is then carried to the key locations in the deposition system 100 in a vapor phase or gaseous state. Specifically, an inert carrier gas source (e.g., 128, 144 or the like) provides an inert carrier gas to a bubbler 602 via a bubbler inlet line 604 and valve 606. The carrier gas flows through the inlet line 604 that is below a level of liquid purge additive 608 in the bubbler 602. The carrier gas bubbles through the liquid purge additive 608 and bubbles 610 of carrier gas rise through the liquid purge additive 608. As the bubbles 610 rise and burst at the surface of the liquid purge additive 608, small quantities of liquid purge additive become dissolved in the carrier gas. The carrier gas and dissolved purge additive leave the bubbler 602 through an outlet line 612 and valve 614, located above the level of the liquid purge additive. The outlet line 612 is in turn connected to purge additive transfer lines 202, 206, 210 and 302 as discussed earlier to deliver the required purge additive. Optionally, the purge additive delivery system 600 may have a bypass line 616 and valve 618 if it is necessary to remove the flow of purge additive to the transfer lines 202, 206, 210 and 302.

Although only four purge additive transfer lines are shown and described, it is within the spirit and scope the subject invention that any number of purge additive transfer lines may be incorporated into and at any location in the deposition system 100 to create the desired effect of purging residual precursor material from portions of the system. Additionally, the precursor and purge additive materials have been only generally related to in the subject invention. In a preferred embodiment, the invention incorporates the use of a precursor blend of Cupraselect further comprising Cu, (hfac) and TMVS. Such an embodiment would further incorporate an additive of TMVS in the purge additive transfer lines to stabilize the Cupraselect®. This however does not preclude the use of other precursors and additives that are well known to those skilled in the art of CVD.

Figure 4A:
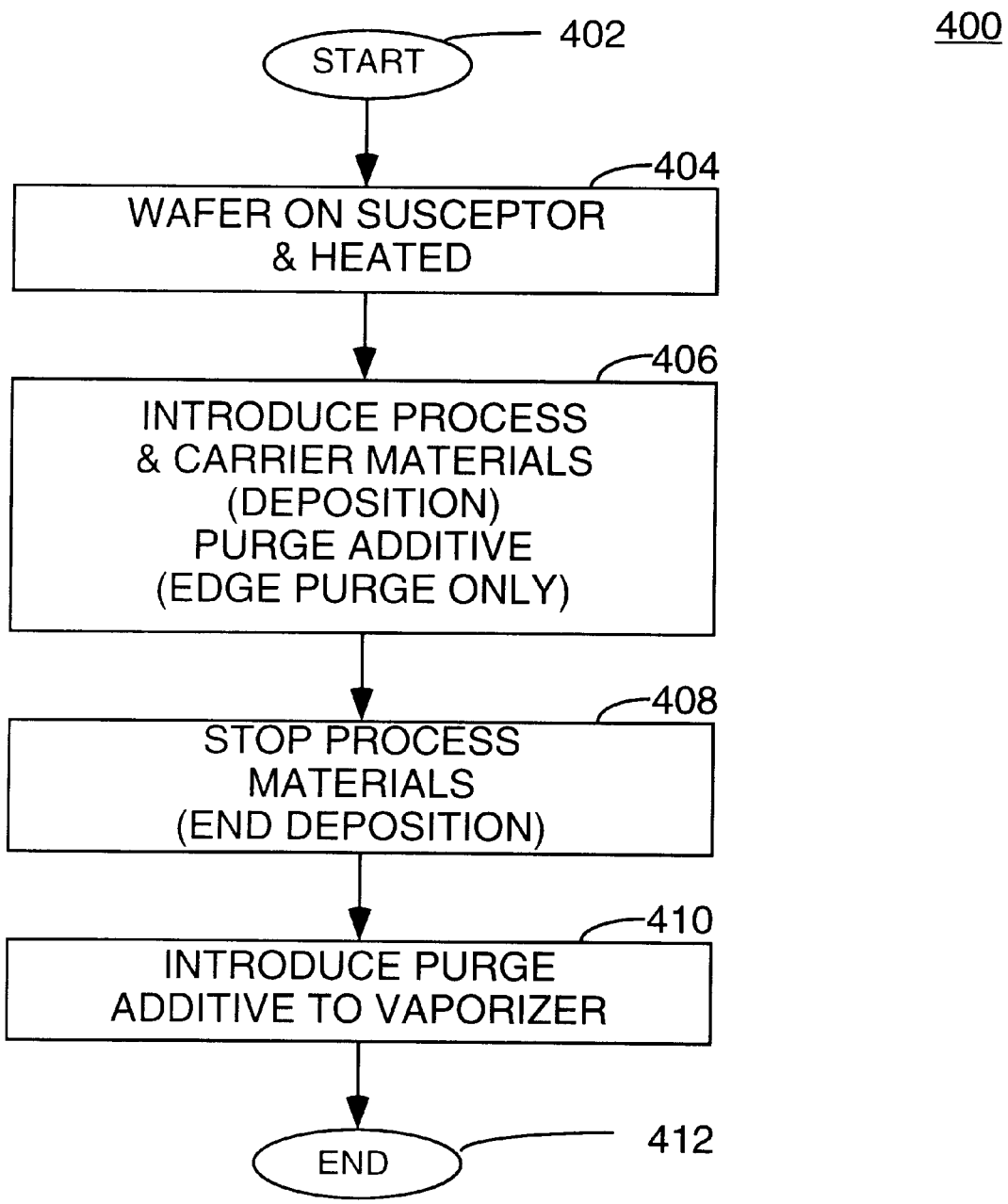
FIG. 4a illustrates a flow chart depicting an embodiment of method steps of the present invention.

A method for the improved control of precursor material and purge additives of the present invention is described below. The method is best understood by simultaneously referring to FIGS. 1–4. Specifically, FIG. 4A sets forth a sequence of steps 400 for improving the control of precursor material and purge additive in a substrate deposition process system such as that depicted in FIGS. 1–3. The method starts at step 402 and proceeds to step 404 wherein a substrate such as a semiconductor wafer has been previously loaded into a process chamber and heated by heating element 148 in susceptor 116. One or more process materials (i.e., precursors and carriers) (i.e. vaporized Cupraselect® and Argon gas) are introduced (flowed) into the chamber at step 406 so as to begin a CVD of the wafer. Simultaneously, a purge additive is introduced at the exclusion zone of the wafer to both physically and chemically act upon precursor materials thereby stabilizing and/or reducing reactions at the wafer edge. In a preferred embodiment of the invention, TMVS is introduced at step 406 to stabilize and purge reactants at the exclusion zone.

At step 408 with the preferred layer of material deposited on the wafer, the flow of process materials is stopped, the CVD process is halted and the wafer is removed from the chamber. At step 410, purging of the vaporizer is accomplished by introducing a chemically stabilizing purge additive (i.e., TMVS) into the system as previously discussed. As such, extraneous Cu does not plate on the inside or clog vaporizer or showerhead orifices.

Figure 4B:
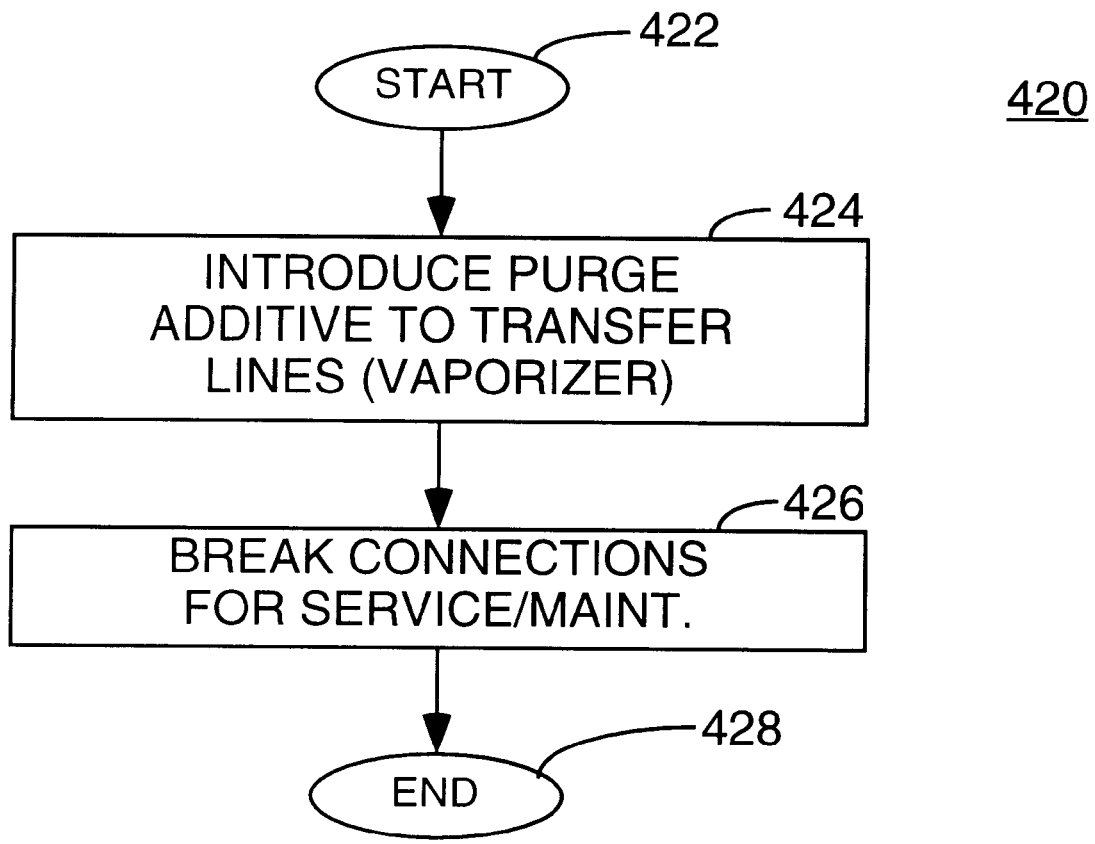
FIG. 4b illustrates an alternate embodiment of the method of the present invention.

An alternate method for the improved control of precursor material and purge additives of the present invention is described in detail below and is set forth in FIG. 4B. Specifically, a sequence of steps 420 for improved control of said materials during a service or maintenance cycle of a deposition system such as the deposition system 100 described above is given. In such maintenance cycle, normal deposition operations are suspended while a maintenance operation is performed to extend or adjust system performance. For example, method 420 is used to change a precursor material source which requires opening one or more portions of the deposition system 100 to atmosphere. Such conditions can cause residual precursor material in the transfer lines or vaporizer to plate, clog or otherwise condense thereby producing contaminant particles in the system and degrade the condition and performance of such components. The method starts at 422 and proceeds to step 424 where a purge additive is introduced to one or more precursor material transfer lines such as 142 of the deposition system 100 to purge said lines of precursor material, process material or the like remaining in the lines after a final deposition operation just prior to the start of the method 420. Alternately, the purge additive may be introduced to a vaporizer, such as vaporizer 140 in deposition system 100, or any other component that is contacted by precursor material that must be purged from the system. Once any residual precursor material is either purged from the system or chemically stabilized by the purge additive, the method proceeds to step 426 where the appropriate connections in the system are broken, the system exposed to atmosphere and the required maintenance performed. For example, a new liquid precursor ampoule installed. The method ends at step 428.

Figure 5:
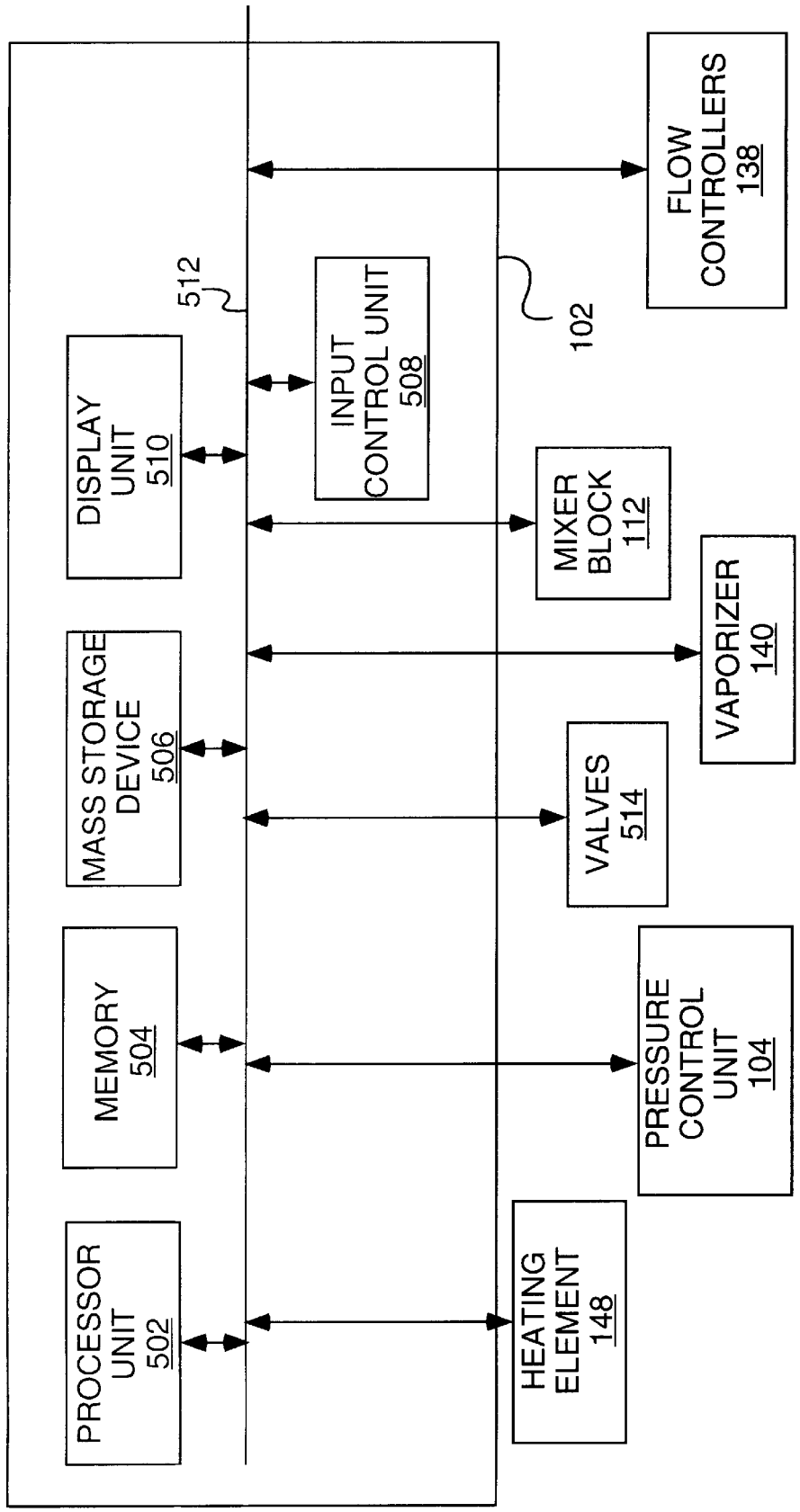
FIG. 5 illustrates a block diagram of a process control system of the subject invention.

The above-described process steps 400 or 420 for controlling precursor and purge material can be performed in a system that is controlled by a process control system 102. FIG. 5 shows a detailed block diagram of the process control system 102 depicted in FIG. 1 that can be employed in such a capacity. The process control system 102 includes a processor unit 502, a memory 504, a mass storage device 506, an input control unit 508, and a display unit 510 which are all coupled to a control unit bus 512.

The processor unit 502 forms a general purpose computer that becomes a specific purpose computer when executing programs such as a program for implementing the purge of process material method of the present invention. Although the invention is described herein as being implemented in software and executed upon a general purpose computer, those skilled in the art will realize that the method of the present invention could be operated using hardware such as an application specific integrated circuit (ASIC) or other hardware circuitry. As such, the invention should be understood as being able to be implemented, in whole or in part, in software, hardware or both.

The processor unit 502 is either a microprocessor or other engine that is capable of executing instructions stored in a memory. The memory 504 can be comprised of a hard disk drive, random access memory ("RAM"), read only memory ("ROM"), a combination of RAM and ROM, or another processor readable storage medium. The memory 504 contains instructions that the processor unit 502 executes to facilitate the performance of the above mentioned process steps. The instructions in the memory 504 are in the form of program code. The program code may conform to any one of a number of different programming languages. For example, the program code can be written in C+, C++, BASIC, Pascal, or a number of other languages.

The mass storage device 506 stores data and instructions and retrieves data and program code instructions from a processor readable storage medium, such as a magnetic disk or magnetic tape. For example, the mass storage device 506 can be a hard disk drive, floppy disk drive, tape drive, or optical disk drive. The mass storage device 506 stores and retrieves the instructions in response to directions that it receives from the processor unit 502. Data and program code instructions that are stored and retrieved by the mass storage device 506 are employed by the processor unit 502 for performing the above mentioned process steps. The data and program code instructions are first retrieved by the mass storage device 506 from a medium and then transferred to the memory 506 for use by the processor unit 502.

The display unit 510 provides information to a chamber operator in the form of graphical displays and alphanumeric characters under control of the processor unit 502. The input control unit 508 couples a data input device, such as a keyboard, mouse, or light pen, to the system 102 to provide for the receipt of a chamber operator's inputs.

The control unit bus 512 provides for the transfer of data and control signals between all of the devices that are coupled to the control unit bus 512. Although the control unit bus is displayed as a single bus that directly connects the devices in the system 102, the control unit bus 512 can also be a collection of busses. For example, the display unit 510, input system 508 and mass storage device 506 can be coupled to an input-output peripheral bus, while the processor unit 502 and memory 504 are coupled to a local processor bus. The local processor bus and input-output peripheral bus are coupled together to form the control unit bus 512.

As previously discussed, the process control system 102 is coupled to the elements of the deposition system 100, employed in purging process material in accordance with the present invention. Each of these elements is coupled to the control unit bus 512 to facilitate communication between the system 102 and the element. These elements include but are not limited to the following: valves 514 (such as valves 120, 123, 130, 136 of FIG. 1; 204, 208 212 214 and 218 of FIG. 2 and 308 of FIG. 3), the heating element 148, the pressure control unit 104, vaporizer 140, the mixer block 112, and flow controller 138. The control unit 102 provides signals to the chamber elements that cause the elements to perform the operations described above for the process steps of controlling and purging the process material as necessary.

In operation, the processor unit 502 directs the operation of the chamber elements in response to the program code instructions that it retrieves from the memory 504. In response to these instructions, the chamber elements are directed to perform the process steps described above (for example, with reference to FIG. 4A). Once a wafer is placed in the processing chamber, it is heated to a temperature desirable for CVD in step 404. In order to perform the heating in step 404, the processor unit 502 executes instructions retrieved from the memory 504. The execution of these instructions results in the elements of the deposition system being operated to bring the wafer to a temperature desirable for CVD (i.e., turning on of the heating element 148). In order to perform the introduction of process and carrier materials in step 406, the processor unit 502 executes instructions retrieved from the memory 504. The execution of these instructions results in the elements of the deposition system being operated to begin CVD upon the wafer (i.e., opening of valves 130, 136, activation of vaporizer 140 and pressure control unit 104 to establish conditions desirable for CVD). In order to perform the edge purge in processor unit 502 executes instructions retrieved from the memory 504. The execution of these instructions results in the elements of the deposition system being operated to direct purge additive and carrier gas to the edge of the wafer (i.e., activation of valve 304). In order to perform the purge step 410, the processor unit 502 executes instructions retrieved from the memory 504 such as activation of valves 208 and/or 212 to purge the vaporizer and transfer line 142. Additionally, processor unit 502 can execute instructions retrieved from the memory 504 to purge the ampoule by activation of valve 204.

The present invention clearly provides a means for improving the properties of copper films deposited by CVD by controlled addition and placement of purge material. Furthermore, the results are consistently repeatable from wafer to wafer. As such, controlled placement and delivery of purge material during the growth of copper films by CVD in accordance with the present invention can be applied to manufacturing of semiconductor substrates.

Although various embodiments which incorporate the teachings of the present invention have been shown and described in detail herein, those skilled in the art can readily devise many other varied embodiments that still incorporate these teachings.

What is claimed is:

1. Apparatus for control of purge additive material in a deposition process system comprising:
    a purge additive delivery system inlet line;
    a purge additive delivery system containment vessel communicating with said inlet line;
    a purge additive delivery system outlet line communicating with said containment vessel; and
    a plurality of purge additive transfer lines communicating with said outlet line and connected to the deposition process system.

2. The apparatus of claim 1 further comprising a plurality of purge additive transfer lines communicating between said deposition process system and said purge additive delivery system.

3. The apparatus of claim 1 wherein the deposition process system further comprises a precursor material delivery system having:
    an ampoule;
    a liquid mass flow controller connected to the ampoule; and
    a vaporizer connected to the liquid mass flow controller.

4. The apparatus of claim 3 wherein one of the plurality of purge additive transfer lines is connected between the ampoule and the liquid mass flow controller.

5. The apparatus of claim 3 wherein one of the plurality of purge additive transfer lines is connected between the liquid mass flow controller and the vaporizer.

6. The apparatus of claim 3 wherein one of the plurality of purge additive transfer lines is connected to the vaporizer.

7. The apparatus of claim 1 wherein the deposition system further comprises a process chamber having a susceptor and connected to the precursor material delivery system.

8. The apparatus of claim 7 wherein one of the plurality of purge additive transfer lines is connected to the susceptor.

9. Apparatus for control of and purge additive material comprising:
    a process chamber;
    a precursor material delivery system connected to said process chamber;
    a purge additive delivery system connected to said process chamber and said precursor delivery system wherein said purge additive delivery system further comprises
    a purge additive delivery system inlet line;
    a purge additive delivery system containment vessel communicating with said inlet line;
    a purge additive delivery system outlet line communicating with said containment vessel; and
    a plurality of purge additive transfer lines communicating with said outlet line and connected to the process chamber and the precursor delivery system.

10. The apparatus of claim 9 wherein the purge additive delivery system is connected to said process chamber and said precursor delivery system via a plurality of purge additive transfer lines.

11. The apparatus of claim 9 wherein the precursor material delivery system further comprises:
    an ampoule;

a liquid mass flow controller connected to the ampoule; and a vaporizer connected to the liquid mass flow controller.

12. The apparatus of claim 11 wherein one of the plurality of purge additive transfer lines is connected between the ampoule and the liquid mass flow controller.

13. The apparatus of claim 11 wherein one of the plurality of purge additive transfer lines is connected between the liquid mass flow controller and the vaporizer.

14. The apparatus of claim 11 wherein one of the plurality of purge additive transfer lines is connected to the vaporizer.

15. The apparatus of claim 9 wherein the process chamber further comprises a susceptor.

16. The apparatus of claim 15 wherein one of the plurality of purge additive transfer lines is connected to the susceptor.

* * * * *

UNITED STATES PATENT AND TRADEMARK OFFICE
CERTIFICATE OF CORRECTION

PATENT NO. : 6,179,925 B1  Page 1 of 1
DATED : January 30, 2001
INVENTOR(S) : John Schmitt, Bo Zheng, Mei Chang, Stephen Voss It is certified that error appears in the above-identified patent and that said Letters Patent is hereby corrected as shown below:

Delete claims 2 and 10.

Signed and Sealed this

Eighteenth Day of December, 2001

Attest:

Attesting Officer

JAMES E. ROGAN
*Director of the United States Patent and Trademark Office*